United States Patent [19]
Lopatin et al.

[11] Patent Number: 6,033,982
[45] Date of Patent: Mar. 7, 2000

[54] SCALED INTERCONNECT ANODIZATION FOR HIGH FREQUENCY APPLICATIONS

[75] Inventors: Sergey Lopatin, Santa Clara; Robin Cheung, Cupertino, both of Calif.

[73] Assignee: Advanced Micro Devices, Inc., Sunnyvale, Calif.

[21] Appl. No.: 09/149,208

[22] Filed: Sep. 8, 1998

[51] Int. Cl.[7] .................. H01L 21/302; H01L 21/306; H01L 21/316; H01L 21/3205; H01L 21/326

[52] U.S. Cl. .................... 438/635; 438/614; 438/622; 438/642; 438/644; 438/688; 257/664; 257/728; 257/753; 257/765

[58] Field of Search .................................... 438/628, 644, 438/688, 614, 635

[56] References Cited

U.S. PATENT DOCUMENTS

| | | | |
|---|---|---|---|
| 4,456,506 | 6/1984 | Stein et al. | 204/15 |
| 5,300,209 | 4/1994 | Mori | 205/325 |
| 5,441,618 | 8/1995 | Matsuda et al. | 204/203 |
| 5,481,084 | 1/1996 | Patrick et al. | 219/123 |
| 5,733,420 | 3/1998 | Matsuda et al. | 204/203 |

*Primary Examiner*—Tom Thomas
*Assistant Examiner*—Bernard E. Souw
*Attorney, Agent, or Firm*—Amin, Eschweiler & Turocy, LLP

[57] ABSTRACT

A method of forming a conductive line structure is provided. An adhesion layer is formed on a substrate surface. A seed layer is formed on the adhesion layer. A conductor is formed on the seed layer to form a partially complete structure. The partially complete structure is exposed to an electrolyte and undergoes an anodization process. At least a portion of the seed layer and a portion of the conductor are transformed to seed layer metal oxide and conductor metal oxide, respectively. At least a portion of the adhesion layer is transformed to an adhesion layer metal oxide and a further portion of the conductor is transformed to the conductor metal oxide. An outer metal layer is formed over the seed layer metal oxide and the conductor metal oxide.

26 Claims, 10 Drawing Sheets

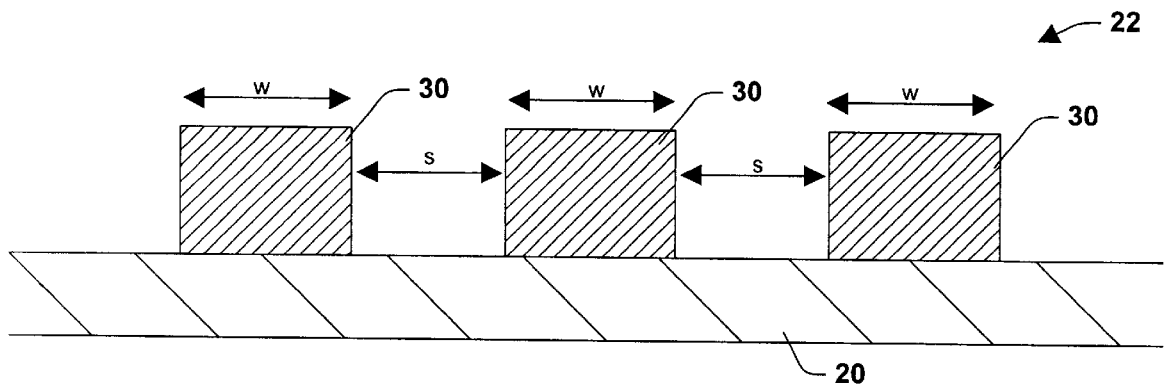
Prior Art    Fig. 1
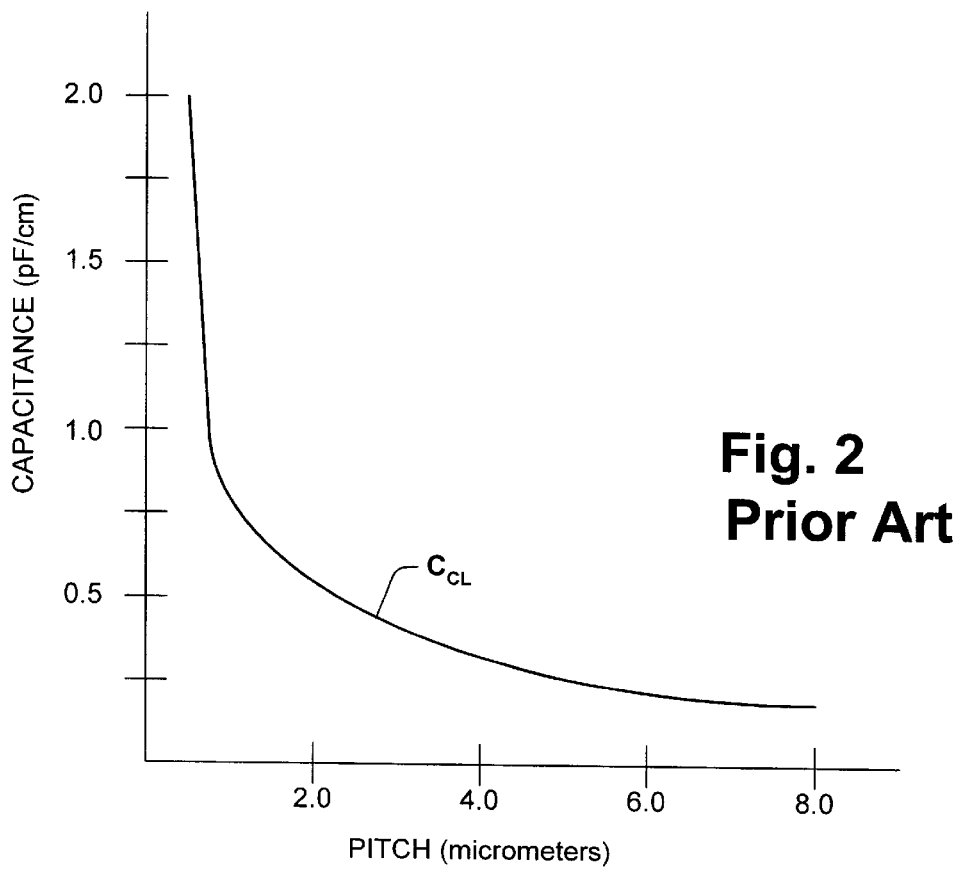
Fig. 2
Prior Art

SCALED INTERCONNECT ANODIZATION FOR HIGH FREQUENCY APPLICATIONS

TECHNICAL FIELD

The present invention generally relates to integrated circuit (IC) fabrication, and in particular to a method of fabricating conductive line(s) within the integrated circuit.

BACKGROUND OF THE INVENTION

There is an increasing demand for miniaturization in the integrated circuits industry. This demand has led to an ever constant reduction in separation between conductive lines (e.g., metal lines) in order to reduce integrated circuit size and/or increase density. The reduced spacing between the conductive lines has the undesirable effect of increasing the capacitance of whatever material lies between the conductive lines. This phenomenon is known as capacitive crosstalk.

In the past, overall integrated circuit (IC) performance depended primarily on device properties, however, this is no longer the case. Parasitic resistance, capacitance and inductance associated with interconnections and contacts of an IC are beginning to become increasingly significant factors in IC performance. In current IC technology, the speed limiting factor is no longer device delay, but the resistive-capacitive (RC) delays associated with the conductive interconnections (e.g., metal lines) of the IC.

Conventional ICs typically employ an interconnect structure wherein a first conductive line is adjacent a second conductive line. If the crosstalk or capacitance between the first conductive line and the second conductive line is high, then the voltage on the first conductive line alters or affects the voltage on the second conductive line. This alteration in voltage may result in the IC being inoperable as a result of misinterpreting logic zeros, logic ones and voltage levels, and consequently incorrectly processing binary and/or analog information.

FIGS. 1 and 2 illustrate the relationship between closely spaced conductive lines and capacitive coupling. Conductive lines 30 are adjacent each other and provide necessary electrical connections between devices of an integrated circuit (not shown). Although only three conductive lines 30 are shown for ease of understanding, it is to be appreciated that many thousands or even millions more such conductive lines may exist in the integrated circuit. As noted above, the increasing demand for miniaturization in the integrated circuits industry has led to an ever constant reduction in separation between the conductive lines 30 in order to reduce integrated circuit size. However, the reduced spacing between the conductive lines 30 has the undesirable effect of increasing the capacitance of whatever material lies between the conductive lines 30 to result in capacitive crosstalk between adjacent conductive lines.

A quantity known as pitch (pitch=w+s) is often employed to characterize conductive capacitance crosstalk for adjacent conductive lines used in the integrated circuit industry, where "w" is the cross-sectional width of a conductive line and "s" is the distance of separation between adjacent conductive lines. FIG. 2 graphically illustrates the capacitance between the conductive lines 30 as a function of physical separation. A reduction in pitch is an ongoing activity in the integrated circuit industry in order to optimize substrate surface area utilization in integrated circuits. The capacitance between the conductive lines 30 labeled $C_{CL}$ in FIG. 2 is shown to increase exponentially as pitch is reduced or as the conductive lines 30 are brought closer together. The increase in capacitive coupling resulting from the conductive lines 30 being brought closer together contributes to capacitive crosstalk between the adjacent conductive lines 30, respectively.

Since market forces are driving the integrated circuitry towards bringing conductive lines closer together in order to maximize substrate surface utilization, it would be desirable to have a method of fabricating a conductive line structure which facilitates isolation of adjacent conductive lines from one another and lowers capacitive coupling between the conductive lines, respectively, and in turn reduces capacitive crosstalk.

SUMMARY OF THE INVENTION

The present invention provides for a conductive line structure which facilitates mitigation of capacitive cross-talk between conductive lines of an IC. The conductive line structure includes a central conductor and a thin dielectric material substantially covering at least a portion of the central conductor projecting from the surface of a substrate. The structure further includes an outer metal layer which covers the thin dielectric material. Thus a conductive line structure of the present invention provides for a central conductor, and a thin dielectric layer and outer metal layer which symmetrically cover the projecting portion of the conductor. The central conductor is thus substantially shielded from passing noise and induced electromagnetic fields resulting from changing signals therein as well as the central conductor being substantially shielded from externally generated noise and electromagnetic fields.

The present invention provides for a method of making a plurality of the conductive line structures. In making the conductive line structures, conductors are formed on an adhesion layer of a semiconductor wafer. Then the wafer is exposed to an electrolytic agent (e.g., orthophosphoric acid, oxalic acid) and a potential is applied between the wafer and a cathodic material (e.g., platinum, bronze). The wafer is employed as an anode (+) and the cathodic material as a cathode (−) in the anodization process of the present invention. The voltage is applied to substantially transform exposed outer areas of the conductor to a metal oxide (e.g., thin dielectric layer). The transformation of the metal of the conductor to metal oxide continues inwardly in the conductor as long as the voltage is applied. The voltage is applied for a sufficient duration such that substantially all of a second metal layer and a metal adhesion layer are transformed into metal oxide(s). Thereafter, a third metal layer is deposited over the partially complete structure—the third metal layer serving as a shielding/grounding layer of the conductive line structure.

The anodization process of the present invention affords for controlling thicknesses of the metal oxide layer(s) with substantial accuracy. Furthermore, the anodization process provides for forming the metal oxide layer(s) with substantially uniform thickness. The resulting conductive line structure facilitates mitigation of capacitive coupling between adjacent conductive lines. Application of the method of the present invention affords for forming high frequency transmission lines with dimensions scaled in situ during anodization. The present invention thus provides for a method of well defining insulating layer thickness in a conductive line interconnect structure. As a result, frequency characteristics of such an interconnect structure may be calculated. Furthermore, capacitance impedance and working frequency may be predicted for the interconnect structure. It is believed the conductive line interconnect structure of the present invention will be useful in high frequency logic technology applications approaching the gigahertz range and beyond.

In accordance with one particular aspect of the invention, a method of forming a conductive line structure is provided. A first metal layer is formed on a substrate. A second metal layer is formed over the first metal layer. A conductor is formed on the second metal layer. Portions of: the first metal layer, the second metal layer and the conductor are transformed to: first metal oxide, second metal oxide and conductor metal oxide, respectively. The conductor is substantially shielded via the metal oxides from an adjacent conductor.

Another aspect of the present invention provides for a conductive line structure which includes: a substrate; an adhesion layer interposed between a conductor and the substrate; a conductor metal oxide layer substantially covering the conductor, the conductor metal oxide being conductor material oxidized via an anodization process; and an outer metal layer substantially covering the conductor metal oxide layer. At least portions of the conductor metal oxide layer and outer metal layer are symmetric to a portion of the conductor projecting from a surface of the substrate.

According to yet another aspect of the present invention, a method of forming a conductive line structure is provided. An adhesion layer is formed on a substrate surface. A seed layer is formed on the adhesion layer. A conductor is formed on the seed layer to form a partially complete structure. The partially complete structure is exposed to an electrolyte and undergoes an anodization process. At least a portion of the seed layer and a portion of the conductor are transformed to seed layer metal oxide and conductor metal oxide, respectively. At least a portion of the adhesion layer is transformed to an adhesion layer metal oxide and a further portion of the conductor is transformed to the conductor metal oxide. An outer metal layer is formed over the seed layer metal oxide and the conductor metal oxide.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a schematic cross-sectional illustration of a portion of a prior art semiconductor device including a conductive pattern;

FIG. 2 is a graphical illustration of a relationship between conductive line pitch and capacitive coupling;

DETAILED DESCRIPTION OF THE INVENTION

Figure 3:
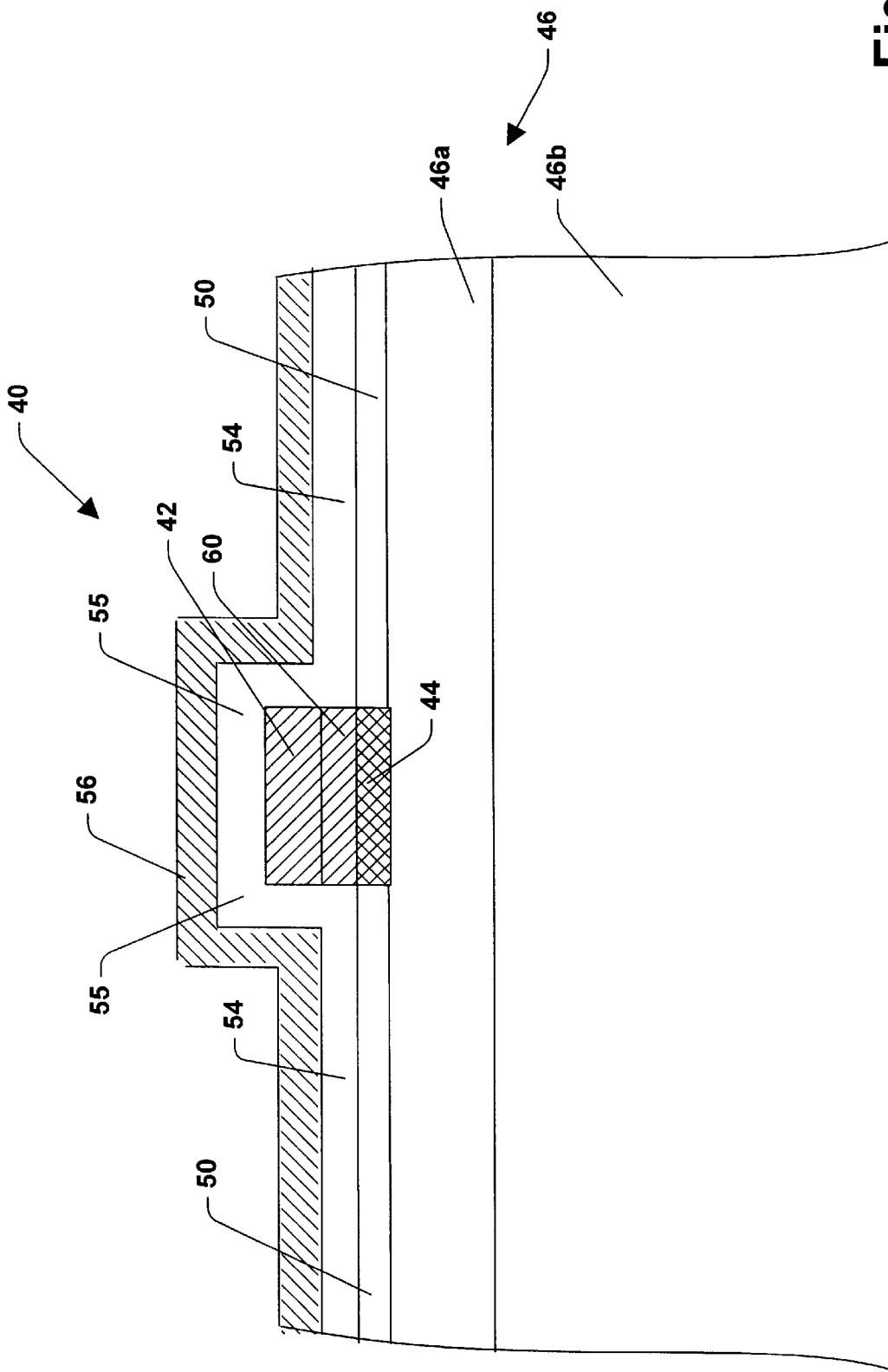
FIG. 3 is a schematic cross-sectional illustration of a substantially complete conductive line structure in accordance with the present invention.

The present invention will now be described with reference to the drawings, wherein like reference numerals are used to refer to like elements throughout. The method of the present invention will be described with reference to the formation of a conductive line structure having at least a central conductor portion substantially covered by a thin dielectric material and an outer metal layer. The following detailed description is of the best modes presently contemplated by the inventors for practicing the invention. It should be understood that the description of these preferred embodiments are merely illustrative and that they should not be taken in a limiting sense. Although the invention is primarily described within the context of integrated circuit fabrication, it is to be appreciated that the present invention has wide applicability to many areas such as for example package interconnects, multi-chip module interconnects, and printed circuit board interconnects.

Referring initially to FIG. 3, a partial cross-sectional illustration is shown of a conductive line structure 40 in accordance with the present invention. The conductive line structure 40 includes a conductor 42 formed on a seed layer 60 which lies on a metal adhesion layer 44. The metal adhesion layer 44 lies atop an insulated substrate 46. The metal adhesion layer 44 is interposed between adhesion layer metal oxides 50 (first metal oxide layers), which also lie atop the substrate 46. The structure 40 further includes seed layer metal oxide layers 54 (second metal oxide layer) which lie over the first metal oxide layers 50. The seed layer 60 is interposed between the seed layer metal oxide layers 54. The structure 40 also includes a conductor metal oxide 55 which lies over the portion of the conductor 42 projecting away from the substrate 46. A metal blanket layer 56 which may be grounded lies over the second metal oxide layer 54 and the conductor metal oxide 55.

The structure 40 operates in a manner substantially similar to a coaxial conductor. The current carrying conductor 42 of the structure 40 is shielded from adjacent conductors by the second metal oxide layer 54, the conductor metal oxide 55 and the outer metal layer 56. As will be discussed in greater detail below, an anodization process is employed to form the second metal oxide layer 54 and conductor metal oxide 55. This anodization process provides for controlling the thickness of the second metal oxide layer 54 and conductor metal oxide 55 with substantial accuracy as well as providing for substantially uniform thickness of the second metal oxide layer 54 and conductor metal oxide 55 throughout the structure 40. The conductive line structure 40 of the present invention enhances the functionality of the resulting IC employing the structure 40 by facilitating the mitigation of capacitive crosstalk between adjacent conductive lines of the IC.

Figure 4:
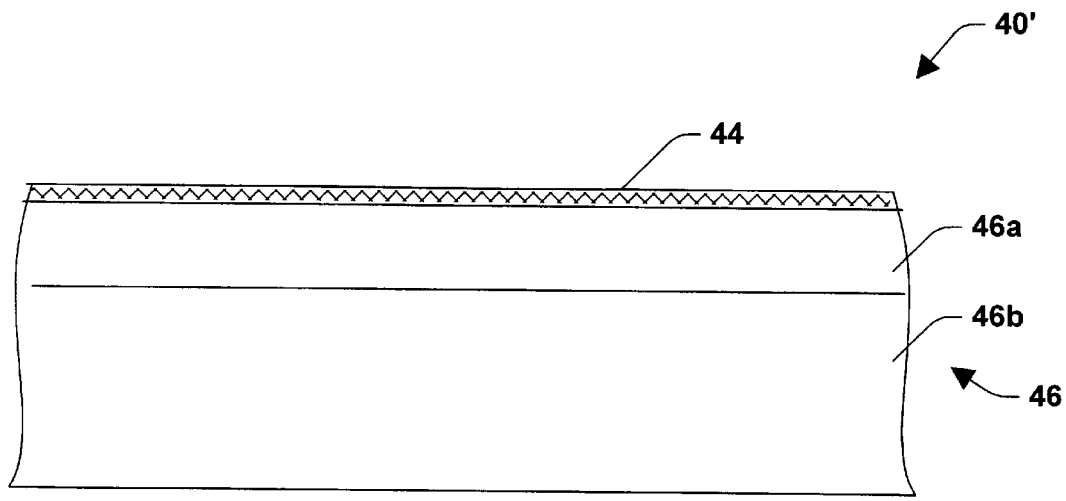
FIG. 4 illustrates a step of applying an adhesion layer ($ME_1$) over a silicon substrate layer in accordance with the present invention.

Referring now to FIGS. 4–11, steps for fabricating the conductive line structure 40 are described. In FIG. 4, the insulated substrate 46 is shown with the metal adhesion layer 44 (first metal layer) formed thereon. As can be seen, the metal adhesion layer 44 covers substantially the entire surface of the substrate 46. The substrate 46 includes an insulating layer ($SiO_2$) 46a and a base substrate layer (Si) 46b. The insulating layer 46a may be formed on the base substrate layer 46b via a suitable deposition technique such as for example using chemical vapor deposition (CVD) or by a spinning technique. Both the insulating layer 46a and the base substrate layer 46b are referenced in common for ease of understanding as substrate 46. It is to be appreciated that any suitable substrate may be employed to carry out the present invention.

As will be described in greater detail below, portions of the metal adhesion layer 44 will be transformed into an insulating metal oxide via an anodization process. The metal adhesion layer 44 preferably includes at least one of: tantalum, tantalum nitride, titanium, titanium nitride, titanium tungsten alloy or combination thereof. However, any suitable material may be employed for the metal adhesion layer 44 and such material is intended to fall within the scope of the hereto appended claims. The metal adhesion layer 44 promotes adhesion between the substrate 46 and the conductor 42 (FIG. 3). The metal adhesion layer 44 also facilitates arresting of interdiffusion of material from the conductor 42 and seed layer 60 into the substrate 46. The metal adhesion layer 44 preferably has a thickness within the range of about 50–300 Å, however, the thickness may be suitably tailored as desired for carrying out the present invention.

Figure 5:
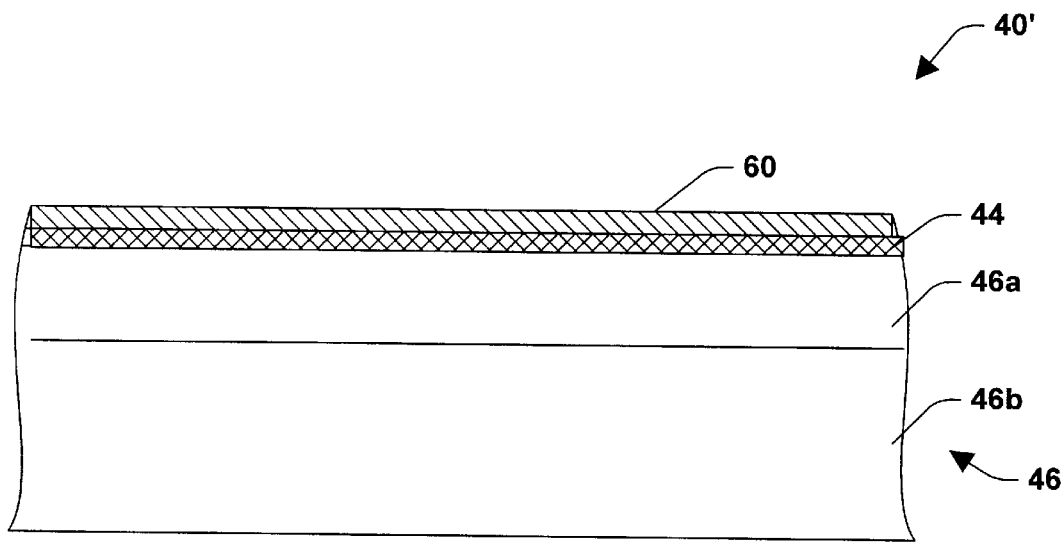
FIG. 5 illustrates a second metal layer ($ME_2$) formed over the adhesion layer of FIG. 4 in accordance with the present invention.

FIG. 5 illustrates a seed layer (second metal layer) 60 formed over the adhesion layer 44. Generally, the seed layer 60 is deposited or grown on the adhesion layer 44 using suitable techniques well known in the art. The seed layer 60 preferably has a thickness with the range of 100–1500 Å, however, the thickness may be suitably tailored as desired for carrying out the present invention. The seed layer 60 typically includes the same material as the conductor 42 (FIG. 3) to be formed, which preferably is aluminum (Al) or copper (Cu). However, any suitable material (e.g., titanium, titanium alloys, tungsten, tungsten alloys, aluminum alloys, copper alloys and polycrystalline silicon) may be employed for carrying out the present invention. As will be apparent from the discussion below, substantial portions of the seed layer 60 is anodized so as to transform into an insulating metal oxide (seed layer metal oxide 54).

Figure 6:
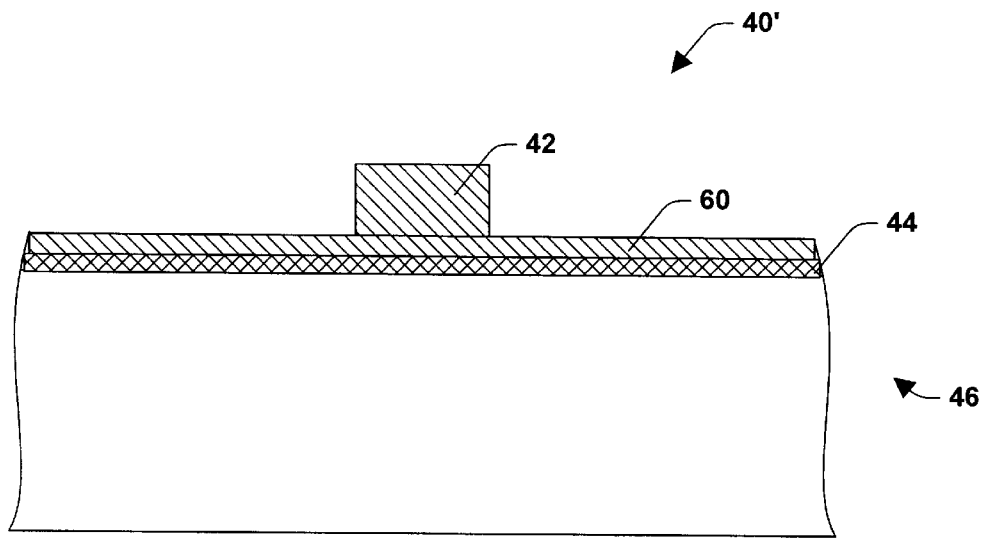
FIG. 6 illustrates a conductor formed over the second metal layer of FIG. 5 in accordance with the present invention.

Turning now to FIG. 6, the conductor 42 is formed over the seed layer ( second metal layer) 60. Although only one conductor 42 is shown for sake of simplicity, it is to be appreciated that a conductive pattern (e.g., including a plurality of conductors) is formed over the seed layer 60. Preferably a metalization pattern is formed by depositing a metalization layer and patterning—employing suitable photolithographic and etching techniques (e.g., anisotropic etching such as reactive ion etching). The conductive pattern may be deposited by any of a variety of suitable deposition techniques, such as CVD processes including low pressure chemical vapor deposition (LPCVD), plasma enhanced chemical vapor deposition (PECVD), melting or sputtering, electroplating or electroless deposition.

The conductive pattern formed in the claimed invention may comprise any suitable conductive material employable for forming conductive patterns in the semiconductor industry. Like the seed layer 60, the conductive material includes preferably a member selected from the group consisting of refractory materials, such as titanium, titanium alloys, tungsten, tungsten alloys, aluminum, aluminum alloys, copper, copper alloys and polycrystalline silicon.

Figure 7:
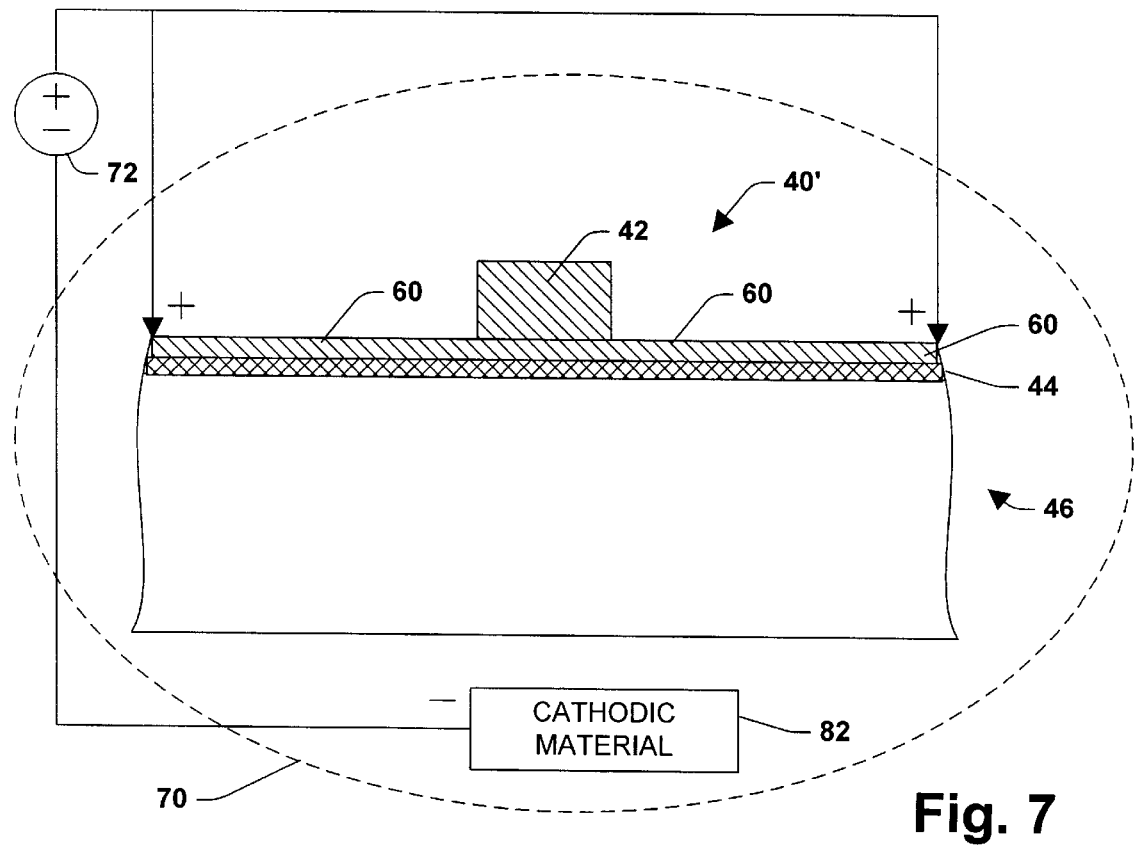
FIG. 7 is a schematic illustration of the structure of FIG. 6 being exposed to an electrolyte and the $ME_1$ material undergoing an anodization process in accordance with the present invention.

FIG. 7 illustrates the partially complete conductive line structure 40' undergoing an anodization process. The partially complete structure 40' is exposed to an electrolytic solution 70 (e.g., orthophosphoric acid, oxalic acid or any other suitable solution) at room temperature. Preferably, either a 70% solution of orthophosphoric acid or 70% solution of oxalic acid is employed as the electrolyte 70. A cathodic material 82 (e.g., platinum, bronze or the like) is also exposed to the electrolytic solution 70. A power supply 72 applies a suitable voltage (e.g., 1–5 volts) across the cathode 82 and the to be anodized partially complete conductive line structure 40'. The negative terminal of the power supply 72 is coupled to the cathodic material 82, and the positive terminal of the power supply 72 is coupled at one or more locations (or preferably by continuous ring contact) to structure 40'. Preferably, the positive terminal of the power supply 72 is coupled to the seed layer 60 at the edges of the structure 40'.

When the voltage is applied between the structure 40' and the opposing negative electrode (cathode) 82 in the electrolytic solution 70, the structure 40' serving as a positive electrode (anode) begins to anodize from its surface (e.g., seed layer 60 and conductor 42) inwardly. The voltage (and duration) may be selectively applied in accordance with the thickness of the seed layer 60, conductive line 42 and the degree of oxidation thereof desired. Preferably DC voltage is applied, however, an AC voltage or combination thereof may be employed. Any suitable power supply 72 (e.g., cell) may be employed to carry out the present invention.

Figure 8:
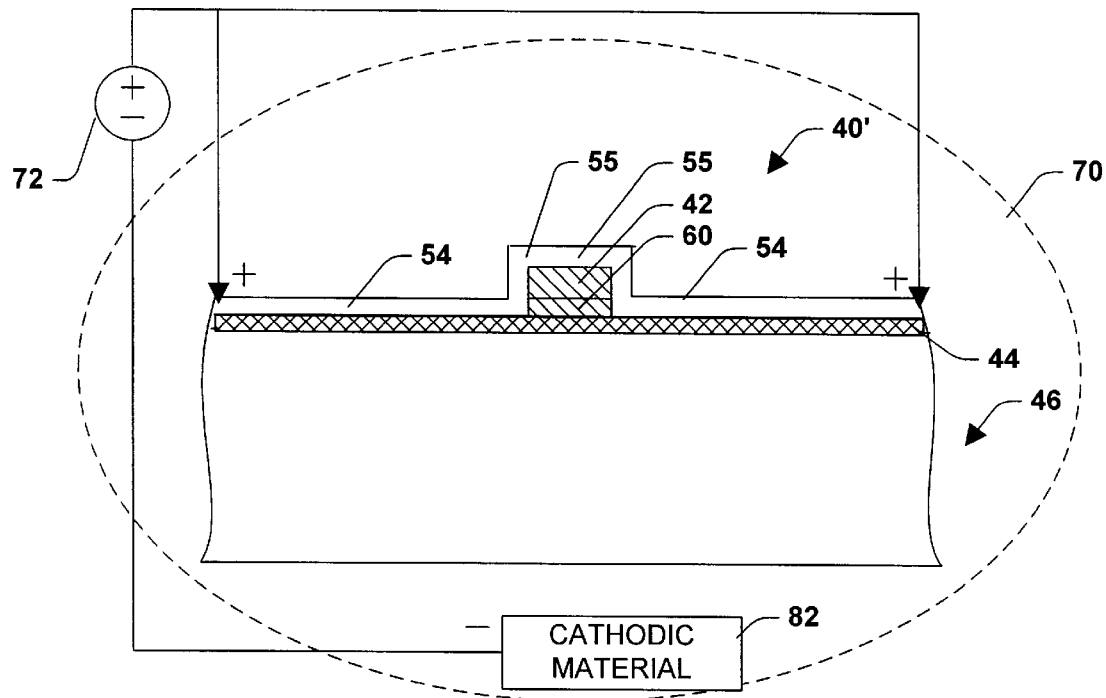
FIG. 8 illustrates the second metal layer of FIG. 7 transformed to a metal oxide and part of the conductor converted to a metal oxide in accordance with the present invention.

Turning now to FIG. 8, the structure 40 is shown after undergoing the anodization process until the substantial portions of the second metal layer 60 have been oxidized and transformed into the seed layer metal oxides 54. The seed layer 60 underlying the conductor 42 is not oxidized because the metal closet to the electrolytic solution 70 oxidizes first. Surfaces of the conductor 42 exposed to the electrolytic solution 70 also are oxidized and transformed to the conductor metal oxide 55. The thickness of inward penetration of oxidation of the conductor 42 thus far is substantially equivalent to the thickness of the second metal layer 60 which has been substantially oxidized (e.g., transformed to $Al_2O_3$ or $CuO_2$). Since the second metal layer 60 and the conductive line 42 are of the same material the rate and degree of oxidation thereof should be substantially equivalent.

Figure 9:
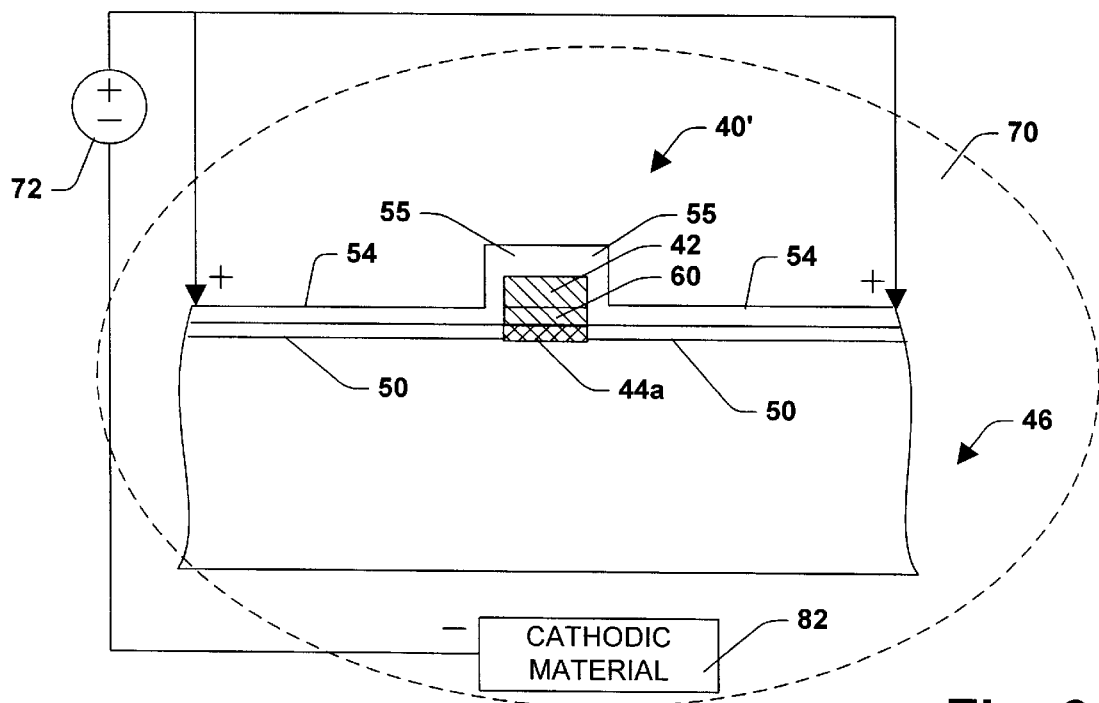
FIG. 9 illustrates the anodization process being continued to transform the adhesion layer ($ME_1$) of FIG. 8 into a metal oxide in accordance with the present invention.

The anodization process is continued as shown in FIG. 9 until the adhesion layer 44 (first metal layer) is substantially oxidized (e.g., transformed to $Ta_2O_5$). The portion 44a of the adhesion layer (first metal layer) underlying the conductive line 42 is not oxidized because the metal closest to the electrolytic solution 70 oxidizes first. Since the conductor 42 is interposed between the electrolytic solution 70, and the adhesion layer portion 44a as well as seed layer 60, the conductor 42 will further oxidize. Tantalum or tantalum nitride are preferred materials for the adhesion layer (first metal layer) 44 for their adhesion qualities and ease to work with. However, it is to be appreciated that other suitable material (e.g., titanium) may be employed and are intended to fall within the scope of the present invention.

It should be noted that titanium is more difficult to work with as an adhesion layer than tantalum or tantalum nitride. The adhesion layer 44 can be oxidized faster or slower depending on the desired structure profile. The rate may be controlled by power supply and electrolyte conditions. Thus the conductor metal oxide 55 will have a thickness slightly different than the combined thickness of the seed layer metal oxide 54 and the adhesion layer metal oxide 50. Although such disparity in the thickness is not desired, an advantage of using the present technique is that the electrolyte chemistry does not need to be changed thus providing for faster and less expensive processing than if the electrolyte chemistry were changed mid-process. However, it is to be appreciated that another aspect of the present invention provides for the electrolyte chemistry to be changed mid-process so that the adhesion layer 44 is oxidized at a faster rate than the conductor 42, or selectively with respect to conductor 42. All such embodiments are intended to fall within the scope of the present invention as defined by the hereto appended claims.

By selectively controlling an initial thickness of the seed layer 60 and adhesion layer 44 control of the amount of conductor 42 transformed to metal oxide (e.g., transformed to $Al_2O_3$ or $CuO$) is facilitated. Furthermore, selective control of the voltage applied during the anodization process further enhances such control of conductor oxidation. Moreover, once the blanket thickness of the seed layer 60 and the adhesion layer 44 are substantially oxidized the anodization process is halted since the anode (e.g. seed layer 60, adhesion layer 44) is no longer conductive as a result of the insulating metal oxides (seed layer metal oxide 54, conductor metal oxide 55 and adhesion layer metal oxide 50). Thus, the anodization process of the present invention is self-regulating in accordance with the selected blanket thickness of the seed layer 60 and adhesion layer 44. Typically, the anodization process is performed for approximately 10–60 seconds to achieve the desired oxidation of the respective metals.

Figure 10:
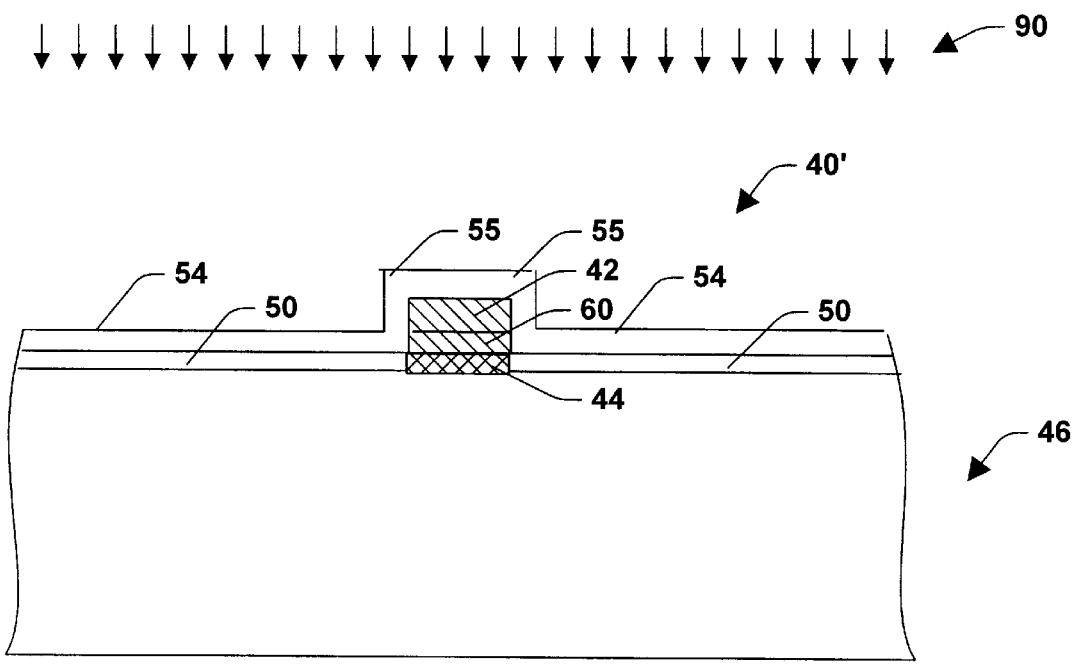
FIG. 10 illustrates the conductive line structure of FIG. 9 being deposited with a third metal layer to form a metal blanket layer over the structure in accordance with the present invention.
Figure 11:
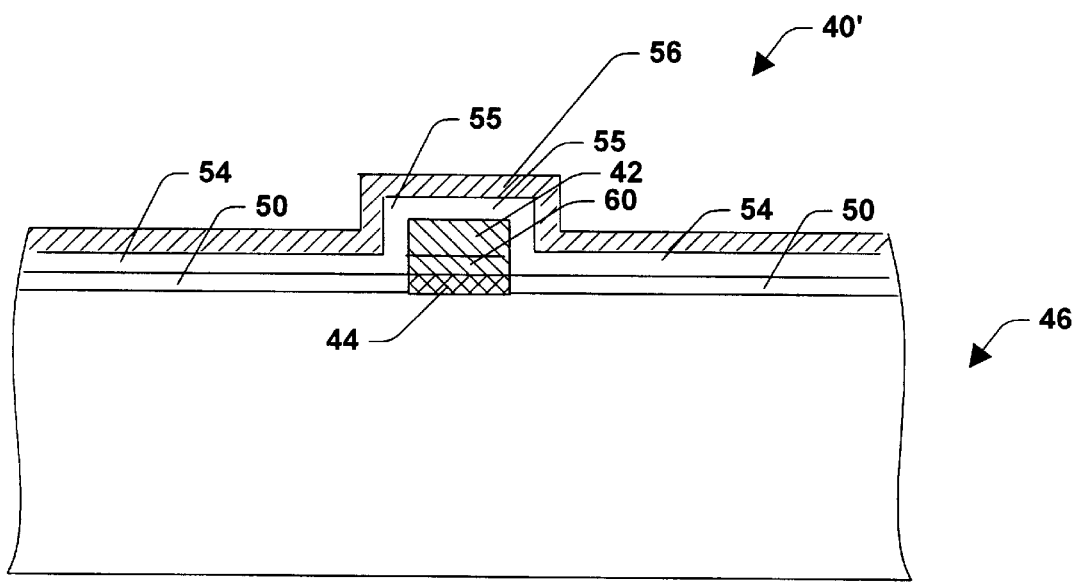
FIG. 11 illustrates the conductive line structure of the present invention substantially complete in relevant part.

FIGS. 10–11 illustrate the conductive line structure 40 after completion of the anodization process. As can be seen, all but the portion of the first metal layer 44a underlying the conductive line 40 has been oxidized substantially into the adhesion layer metal oxide 50 (first metal oxide). The seed layer 60 (except for the portion originally underlying the conductor 42) and outer surfaces of the conductor 42 exposed to the electrolyte 70 have been oxidized to the second metal oxide 54 and the conductor metal oxide 55, respectively. Thus, the projecting portion of the conductor 42 is covered with the insulating conductor metal oxide 55, and adjacent to the conductor 42 lies the insulating seed layer metal oxide 54. The bottom portion of the conductive line 42 lies atop what remains of the adhesion layer 44.

The outer metal layer 56 is shown being applied by reference numeral 90. In FIG. 11, the thin outer metal layer 56 is shown formed over the partially complete conductive line structure 40'. The thin outer metal layer 56 may comprise any suitable material (e.g., $Ta_2N$, Al, Cu and the like) and may be grounded if desired. Although, ion metal plasma deposition (IMPD) is a preferred technique for depositing the thin metal layer 54, it is to be appreciated that other techniques (e.g., atomic layer deposition, vacuum evaporation, chemical vapor deposition, electrochemical deposition) may be employed. Any suitable deposition technique or other means for carrying out the present invention may be employed and is intended to fall within the scope of the present claims. IMPD and the other aforementioned techniques are well known in the art, and thus based on the description herein one skilled in the art could readily carry out suitable deposition techniques to generate the conductive line structure 40 of the present invention.

Thus, the conductive line structure 40 includes the central conductor 42, the outer metal conductive material 56 and the dielectric materials (seed layer metal oxide 54 and conductor metal oxide 55, respectively) interposed between the conductor 42 and the outer conductive material 56. The conductive line structure 40 provides for the signal carrying central conductive line 42 to be substantially surrounded by the outer metal conductor 56 which may be grounded and the insulating dielectric material (seed layer metal oxide 54 and conductor metal oxide 55) interposed there between. The central conductive line 42 is thus substantially shielded from passing noise and induced electromagnetic fields resulting from changing signals therein as well as the central conductive line 42 being substantially shielded from externally generated noise and electromagnetic fields.

It is to be appreciated that the conductive line structure 40 may be employed in a multi-interconnect structure by forming vias in the structure 40 through the outer metal layer 56 and conductor metal oxide 55 to the conductor 42.

Application of the method of the present invention affords for forming high frequency transmission lines with dimensions scaled in situ during anodization. The present invention thus provides for a method of well defining insulating layer thickness in a conductive line interconnect structure. As a result, frequency characteristics of such an interconnect structure may be calculated. Furthermore, capacitance impedance and working frequency may be predicted for the interconnect structure. It is believed the conductive line structure 40 of the present invention will be useful in high frequency logic technology applications approaching the gigahertz range and beyond.

Figure 12:
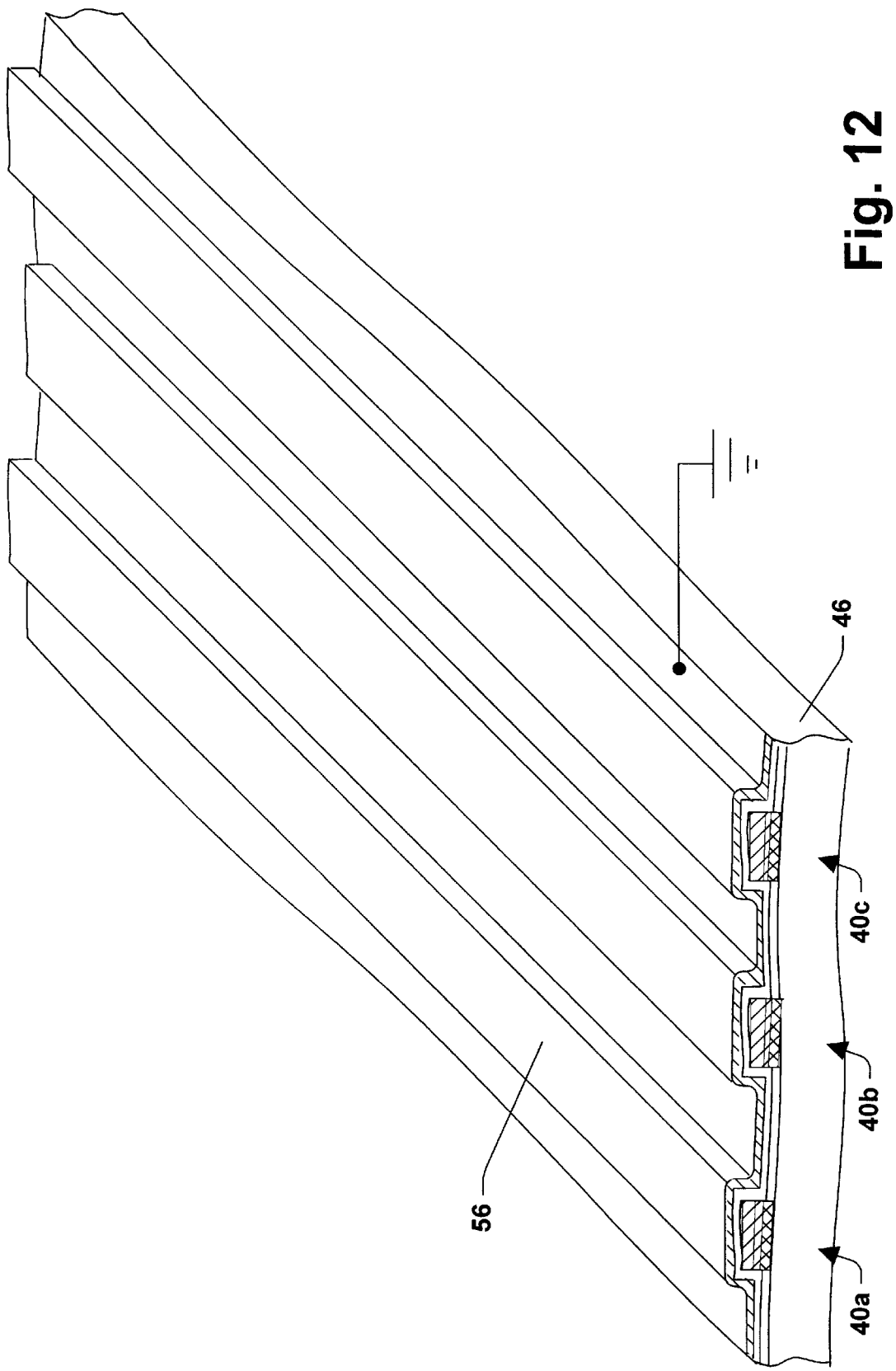
FIG. 12 is a perspective illustration of a plurality of conductive line structures of the present invention wherein the structures share a common metal blanket layer.

FIG. 12 is a perspective illustration of a plurality of conductive line structures (40a, 40b and 40c) in accordance with the present invention wherein the outer metal conductor 56 is commonly shared by the structures 40.

Figure 13:
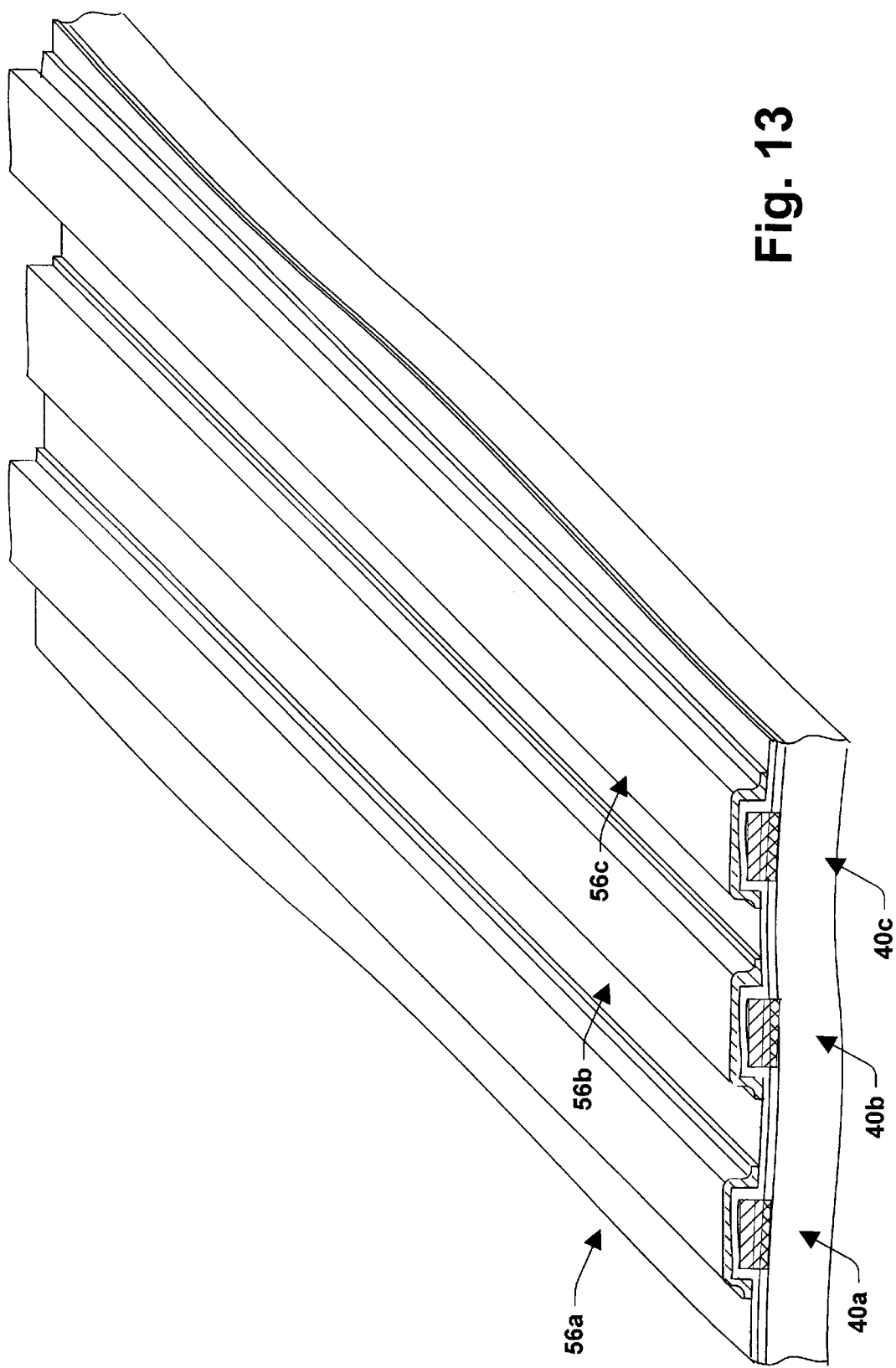
FIG. 13 is a perspective illustration of a plurality of conductive line structures of the present invention wherein the structures have independent metal blanket layers, respectively.

FIG. 13 is a perspective illustration of another aspect of the present invention wherein each conductive line structure 40a, 40b and 40c has an independent outer metal conductor 56a, 56b and 56c, respectively. Such an arrangement can easily be made using suitable photolithographic techniques to mask and etch away portions of the blanket outer metal layer (like in FIG. 12) so as to isolate portions of the outer metal layers 56a, 56b and 56c for each structure 40a, 40b and 40c, respectively.

Figure 14:
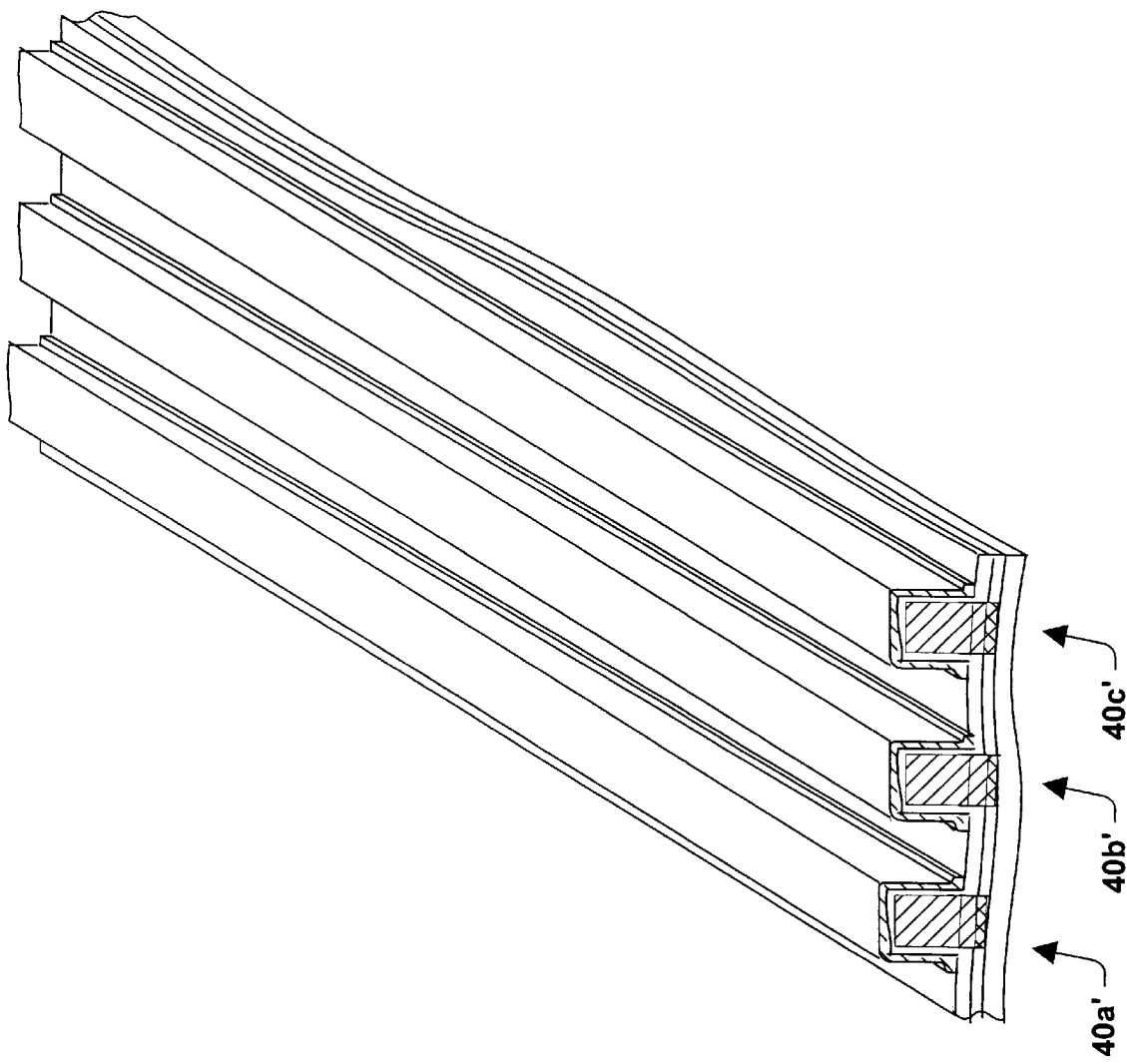
FIG. 14 is a perspective illustration of a plurality of high aspect ratio conductive line structures of the present invention wherein the structures have independent metal blanket layers, respectively.

Although the present invention has been described with respect to conductive line structures with relatively low aspect ratios, it is to be appreciated that the invention may be employed in connection with conductive line structures of high aspect ratio. FIG. 14 is a perspective illustration of such an aspect of the present invention where conductive line structures 40a', 40b' and 40c' have high aspect ratios.

Figure 15:
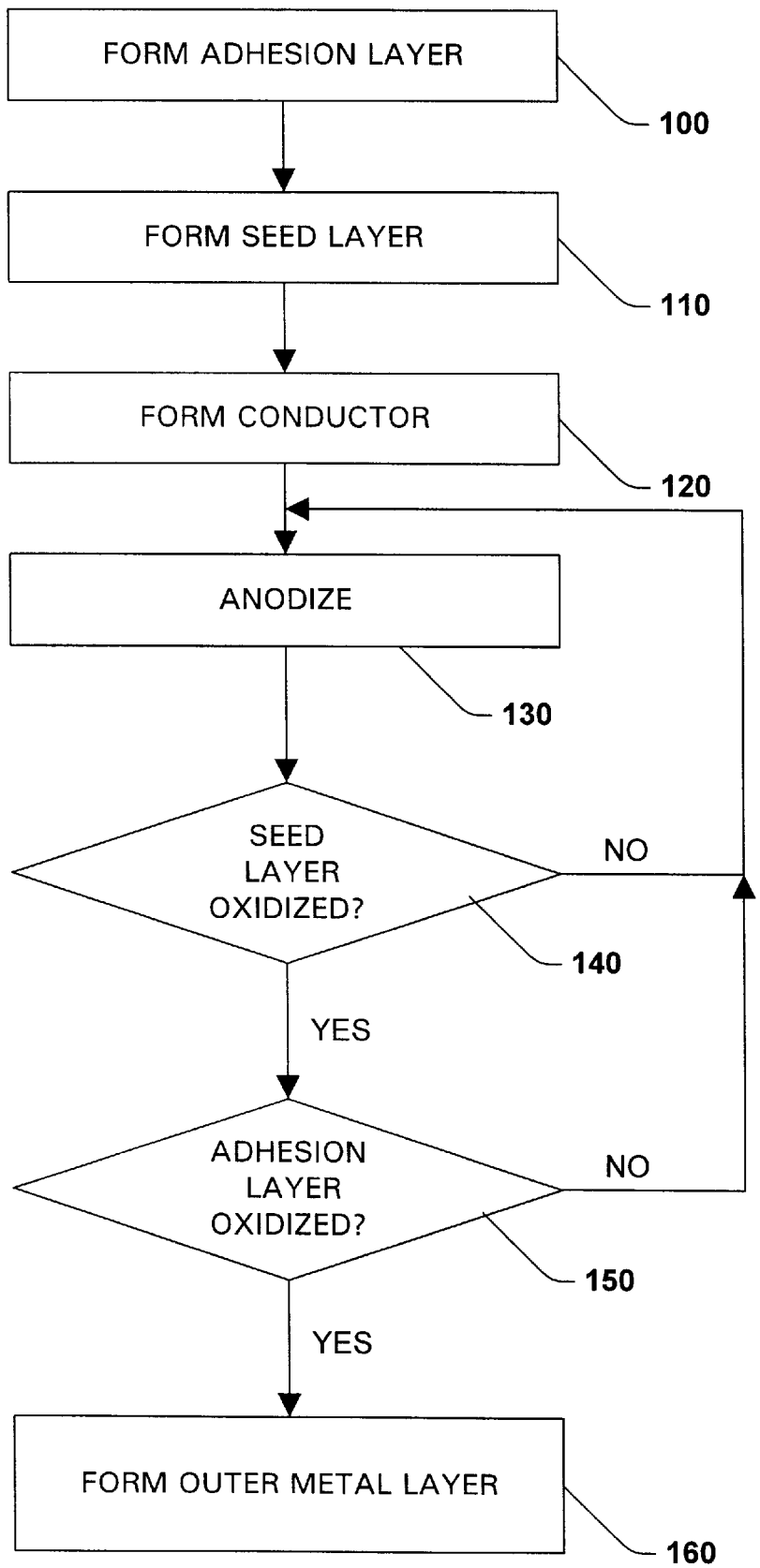
FIG. 15 is a flow diagram illustrating one specific methodology for fabricating a conductive line structure in accordance with the present invention.

Turning now to FIG. 15, one specific methodology for carrying out the present invention is outlined via a flow diagram. In step 100, the adhesion layer 44 is formed on the substrate 46. Next, in step 110 a seed layer (e.g., second metal layer) 60 is formed over the adhesion layer 44. Thicknesses of the seed layer 60 and adhesion layer are selectively controlled in accordance with a desired degree of oxidation of the conductor 42. In step 120, a plurality of conductors 42 are formed over the seed layer 60 using suitable metalization and patterning techniques. In step 130, the partially complete structure 40' (see FIGS. 6–7) undergoes an anodization process. In the anodization process the power source 72 applies a voltage between the cathodic material 82 and the partially complete structure 40' (anode) both of which are exposed to the electrolyte (e.g., orthophosphoric acid, oxalic acid) 70. The anodization process is performed in step 140 until portions of the seed layer (second metal layer) 60 are substantially oxidized with respect to its thickness. Accordingly, projecting portions of the conductor 42 are oxidized in proportion to the thickness of seed layer oxidized. Since the seed layer 60 and conductor 42 are preferably of the same material, the degree and rate of oxidation thereof should be substantially similar. In step 150, the anodization process is continued until portions of the adhesion layer (first metal layer) 44 are substantially oxidized with respect to its thickness. After the anodization process is complete, in step 150 the third metal layer 56 is formed over the oxidized seed layer portions and oxidized portions of the conductor 42. The method is thus substantially complete in relevant part. As discussed above with respect to FIG. 13, the third metal layer 56 may be patterned and etched as desired as well as grounded.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming a conductive line structure, comprising the steps of:
   forming a first metal layer on a substrate;
   forming a second metal layer over the first metal layer;
   forming a conductor on the second metal layer; and
   transforming portions of: the first metal layer, the second metal layer and the conductor to: first metal oxide, second metal oxide and conductor metal oxide, respectively;
   wherein the conductor is substantially shielded via the metal oxides from an adjacent conductor.

2. The method of claim 1 further including a step of forming a third metal layer over the second metal oxide and conductor metal oxide.

3. The method of claim 1 further including a step of patterning and etching the third metal layer.

4. The method of claim 1 further including a step of grounding the third metal layer.

5. The method of claim 1 further including a step of selectively controlling a voltage applied during the anodization process so as to control metal oxide formation thickness.

6. The method of claim 1 further including a step of employing orthophosphoric acid during the anodization process.

7. The method of claim 1 further including a step of employing oxalic acid during the anodization process.

8. The method of claim 1, further including a step of employing the structure as an anode during the anodization process.

9. The method of claim 1, further including a step of employing platinum as a cathode during the anodization process.

10. The method of claim 1, further including a step of employing bronze as a cathode during the anodization process.

11. The method of claim 1, further including a step of employing at least one of tantalum, tantalum nitride, titanium and titanium nitride in forming the first metal layer.

12. The method of claim 1, further including a step of employing one of: titanium, titanium alloys, tungsten, tungsten alloys, aluminum, aluminum alloys, copper, copper alloys and polycrystalline silicon in forming the second metal layer.

13. The method of claim 1, further including a step of employing one of: titanium, titanium alloys, tungsten, tungsten alloys, aluminum, aluminum alloys, copper, copper alloys and polycrystalline silicon in forming the conductor.

14. A method of forming a conductive line structure, comprising the steps of:
   forming an adhesion layer on a substrate surface;
   forming a seed layer on the adhesion layer;
   forming a conductor on the seed layer to form a partially complete structure;
   exposing the partially complete structure to an electrolyte and undergoing an anodization process;
   transforming the at least a portion of the seed layer and a portion of the conductor to seed layer metal oxide and conductor metal oxide, respectively;
   transforming at least a portion of the adhesion layer to an adhesion layer metal oxide and a further portion of the conductor to the conductor metal oxide; and
   forming an outer metal layer over the seed layer metal oxide and the conductor metal oxide.

15. The method of claim 14, further including the step of:
   using at least one of orthophosphoric acid and oxalic acid as the electrolyte.

16. The method of claim 14 further including the step of selecting controlling a power supply during the anodization so as to selectively control metal oxidation.

17. The method of claim 14 further including a step of selectively controlling a thickness of the seed layer so as to facilitate controlling the amount of conductor transformed to the conductor metal oxide.

18. The method of claim 14 further including a step of selectively controlling a thickness of the adhesion layer so as to facilitate controlling the amount of conductor transformed to the conductor metal oxide.

19. The method of claim 14 further including a step of using a same electrolyte chemistry during the anodization process.

20. The method of claim 14 further including a step of varying electrolyte chemistry in order to selectively control an oxidation rate of the adhesion layer.

21. The method of claim 14 further including a step of forming the outer metal layer so as to be shared among a plurality of conductive line structures of an IC.

22. The method of claim 14 further including a step of patterning and etching the outer metal layer such that each of a plurality of conductive line structures of an IC have separate outer metal layers, respectively.

23. The method of claim 14 further including a step of employing at least one of tantalum, tantalum nitrdie, titanium and titanium nitride during formation of the adhesion layer.

24. The method of claim 14, further including a step of employing one of: titanium, titanium alloys, tungsten, tungsten alloys, aluminum, aluminum alloys, copper, copper alloys and polycrystalline silicon in forming the seed layer.

25. The method of claim 14, further including a step of employing one of: titanium, titanium alloys, tungsten, tungsten alloys, aluminum, aluminum alloys, copper, copper alloys and polycrystalline silicon in forming the conductor.

26. The method of claim 14, further including a step of employing one of: titanium, titanium alloys, tungsten, tungsten alloys, aluminum, aluminum alloys, copper, copper alloys and polycrystalline silicon in forming the outer metal layer.

* * * * *